(12) United States Patent
Hamouda

(10) Patent No.: US 8,084,169 B2
(45) Date of Patent: Dec. 27, 2011

(54) DUAL METRIC OPC

(75) Inventor: Ayman Yehia Hamouda, Cairo (EG)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 12/858,430

(22) Filed: Aug. 17, 2010

(65) Prior Publication Data

US 2010/0313173 A1    Dec. 9, 2010

Related U.S. Application Data

(63) Continuation of application No. 11/673,511, filed on Feb. 9, 2007, now Pat. No. 7,799,487.

(51) Int. Cl.
  *G03F 1/00* (2006.01)
  *G06F 17/50* (2006.01)
(52) U.S. Cl. .............................. 430/5; 716/50
(58) Field of Classification Search ............ 430/5, 30, 430/394; 716/50–56
See application file for complete search history.

(56) References Cited

U.S. PATENT DOCUMENTS

| | | |
|---|---|---|
| 4,532,650 A | 7/1985 | Wihl et al. |
| 4,762,396 A | 8/1988 | Dumant et al. |
| 4,989,156 A | 1/1991 | Ikenaga |
| 5,396,584 A | 3/1995 | Lee et al. |
| 5,502,654 A | 3/1996 | Sawahata |
| 5,655,110 A | 8/1997 | Krivokapic et al. |
| 5,699,447 A | 12/1997 | Alumot et al. |
| 5,723,233 A | 3/1998 | Garza et al. |
| 5,815,685 A | 9/1998 | Kamon |
| 5,825,647 A | 10/1998 | Tsudaka |
| 5,879,844 A | 3/1999 | Yamamoto et al. |
| 5,886,908 A | 3/1999 | Conn et al. |
| 5,991,006 A | 11/1999 | Tsudaka |
| 6,016,357 A | 1/2000 | Neary et al. |
| 6,033,814 A | 3/2000 | Burdorf et al. |
| 6,042,257 A | 3/2000 | Tsudaka |
| 6,049,660 A | 4/2000 | Ahn et al. |
| 6,056,785 A | 5/2000 | Chisaka |
| 6,077,310 A | 6/2000 | Yamamoto et al. |
| 6,080,527 A | 6/2000 | Huang et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |

(Continued)

FOREIGN PATENT DOCUMENTS

JP        09-319067        12/1997

(Continued)

OTHER PUBLICATIONS

Adam, K., et al., "Improved Modeling Performance with an Adapted Vectorial Formulation of the Hopkins Imaging Equation," *Proceedings of SPIE, vol. 5040: Optical Microlithography XVI*, Santa Clara, Calif., Feb. 25, 2003, pp. 78-91.

(Continued)

*Primary Examiner* — Stephen Rosasco
(74) *Attorney, Agent, or Firm* — Klarquist Sparkman, LLP

(57) ABSTRACT

A technique for creating mask layout data to print a desired pattern of features via a photolithographic process includes defining one or more subresolution assist features (SRAFs) and performing OPC on printing features and the added SRAF features.

41 Claims, 5 Drawing Sheets

U.S. PATENT DOCUMENTS

| | | | |
|---|---|---|---|
| 6,263,299 B1 | 7/2001 | Aleshin et al. |
| 6,269,472 B1 | 7/2001 | Garza et al. |
| 6,301,697 B1 | 10/2001 | Cobb |
| 6,312,854 B1 | 11/2001 | Chen et al. |
| 6,317,859 B1 | 11/2001 | Papadopoulou |
| 6,370,679 B1 | 4/2002 | Chang et al. |
| 6,415,421 B2 | 7/2002 | Anderson et al. |
| 6,416,907 B1 | 7/2002 | Winder et al. |
| 6,425,113 B1 | 7/2002 | Anderson et al. |
| 6,425,117 B1 | 7/2002 | Pasch et al. |
| 6,430,737 B1 | 8/2002 | Cobb et al. |
| 6,453,452 B1 | 9/2002 | Chang et al. |
| 6,453,457 B1 | 9/2002 | Pierrat et al. |
| 6,467,076 B1 | 10/2002 | Cobb |
| 6,470,489 B1 | 10/2002 | Chang et al. |
| 6,487,503 B2 | 11/2002 | Inui |
| 6,499,003 B2 | 12/2002 | Jones et al. |
| 6,574,784 B1 | 6/2003 | Lippincott et al. |
| 6,601,231 B2 | 7/2003 | LaCour |
| 6,620,561 B2 | 9/2003 | Winder et al. |
| 6,643,616 B1 | 11/2003 | Granik et al. |
| 6,649,309 B2 | 11/2003 | Mukherjee |
| 6,665,845 B1 | 12/2003 | Aingaran et al. |
| 6,668,367 B2 | 12/2003 | Cobb et al. |
| 6,728,946 B1 | 4/2004 | Schellenberg et al. |
| 6,748,578 B2 | 6/2004 | Cobb |
| 6,778,695 B1 | 8/2004 | Schellenberg et al. |
| 6,792,159 B1 | 9/2004 | Aufrichtig et al. |
| 6,792,590 B1 | 9/2004 | Pierrat et al. |
| 6,815,129 B1 | 11/2004 | Bjorkholm et al. |
| 6,817,003 B2 | 11/2004 | Lippincott et al. |
| 6,851,103 B2 | 2/2005 | Van Den Broeke et al. |
| 6,857,109 B2 | 2/2005 | Lippincott |
| 6,862,726 B2 | 3/2005 | Futatsuya et al. |
| 6,887,633 B2 | 5/2005 | Tang |
| 6,901,576 B1 | 5/2005 | Liebmann et al. |
| 6,928,634 B2 | 8/2005 | Granik et al. |
| 6,973,633 B2 | 12/2005 | Lippincott et al. |
| 6,989,229 B2 | 1/2006 | Lucas et al. |
| 7,010,776 B2 | 3/2006 | Gallatin et al. |
| 7,013,439 B2 | 3/2006 | Robles et al. |
| 7,017,141 B2 | 3/2006 | Anderson et al. |
| 7,024,655 B2 | 4/2006 | Cobb |
| 7,028,284 B2 | 4/2006 | Cobb et al. |
| 7,047,516 B2 | 5/2006 | Futatsuya |
| 7,073,162 B2 | 7/2006 | Cobb et al. |
| 7,155,689 B2 | 12/2006 | Pierrat et al. |
| 7,155,699 B2 | 12/2006 | Cobb |
| 7,172,838 B2 | 2/2007 | Maurer et al. |
| 7,181,721 B2 | 2/2007 | Lippincott et al. |
| 7,237,221 B2 | 6/2007 | Granik et al. |
| 7,240,305 B2 | 7/2007 | Lippincott |
| 7,240,321 B2 | 7/2007 | Cobb et al. |
| 7,266,803 B2 | 9/2007 | Chou et al. |
| 7,281,234 B2 | 10/2007 | Lippincott |
| 7,293,249 B2 | 11/2007 | Robles et al. |
| 7,324,930 B2 | 1/2008 | Cobb |
| 7,367,009 B2 | 4/2008 | Cobb et al. |
| 7,378,202 B2 | 5/2008 | Granik et al. |
| 7,382,168 B2 | 6/2008 | Bhattacharya et al. |
| 7,392,168 B2 | 6/2008 | Granik et al. |
| 7,799,487 B2 * | 9/2010 | Hamouda ............ 430/5 |
| 2002/0026626 A1 | 2/2002 | Randall et al. |
| 2002/0094680 A1 | 7/2002 | Lin |
| 2002/0199157 A1 | 12/2002 | Cobb |
| 2003/0170551 A1 | 9/2003 | Futatsuya |
| 2003/0208728 A1 | 11/2003 | Pierrat |
| 2004/0005089 A1 | 1/2004 | Robles et al. |
| 2004/0044431 A1 | 3/2004 | Pellegrini et al. |
| 2004/0088149 A1 | 5/2004 | Cobb |
| 2005/0050490 A1 | 3/2005 | Futatsuya et al. |
| 2005/0053848 A1 | 3/2005 | Wampler et al. |
| 2005/0149900 A1 | 7/2005 | Laidig |
| 2005/0149901 A1 | 7/2005 | Tang |
| 2005/0251771 A1 | 11/2005 | Robles |
| 2005/0278686 A1 | 12/2005 | Word et al. |
| 2006/0188796 A1 | 8/2006 | Word |
| 2006/0190850 A1 | 8/2006 | Kohle et al. |
| 2006/0199084 A1 | 9/2006 | Word |
| 2006/0200790 A1 | 9/2006 | Shang et al. |
| 2006/0240342 A1 | 10/2006 | Tang |
| 2006/0269875 A1 | 11/2006 | Granik |
| 2006/0271905 A1 | 11/2006 | Mukherjee et al. |
| 2007/0006113 A1 | 1/2007 | Hu et al. |
| 2007/0074143 A1 | 3/2007 | Cobb et al. |
| 2007/0118826 A1 | 5/2007 | Lippincott |
| 2007/0124708 A1 | 5/2007 | Robles et al. |
| 2007/0198963 A1 | 8/2007 | Granik et al. |
| 2007/0204242 A1 | 8/2007 | Brunet et al. |
| 2007/0204256 A1 | 8/2007 | Brunet et al. |
| 2007/0277145 A1 | 11/2007 | Scaman |
| 2008/0141195 A1 | 6/2008 | Robles et al. |
| 2008/0148217 A1 | 6/2008 | Park |
| 2008/0166639 A1 | 7/2008 | Park et al. |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/65315 | 9/2001 |
| WO | WO 2006/127438 | 11/2006 |

OTHER PUBLICATIONS

Bailey, G., et al., "Intensive 2D SEM Model Calibration for 45nm and Beyond," *Proceedings of SPIE, vol. 6154: Optical Microlithography XIX*, San Jose, Calif., Feb. 21, 2006, 61542W.

Barouch et al., "Illuminator Optimization for Projection Printing," *Proc. SPIE*, vol. 3679, pp. 697-703 (1999).

Brist et al., "Illumination Optimization Effects on OPC and MDP," *Proc. SPIE*, vol. 5754, pp. 1179-1189 (2005).

Brist, T., et al., "Model-Assisted Placement of Sub-Resolution Assist features: Experimental Results," *Proceedings of SPIE, vol. 5042: Design and Process Integration for Microelectronic Manufacturing*, Santa Clara, Calif. Feb. 27, 2003, pp. 99-106.

Brist et al., "Source Polarization and OPC Effects on Illumination Optimization," *Proceedings of SPIE, 25th Annual BACUS Symposium on Photomask Technology*, vol. 5992, pp. 599232-1/9 (2005).

Brist, T., "Using Grid-based OPC Verification at the 65-nm node and below," MicroMagazine.com. <http://www.micromagazine.com/archive/06/01/brist.html> 2006.

Broeke et al., "Near 0.3 k1 Full Pitch Range Contact Hole Patterning Using Chromeless Phase Lithography (CPL)," *Proc. of SPIE*, vol. 5256, pp. 297-308 (2003).

Brueck, S., et al., "Spatial Frequency Analysis of Optical Lithography Resolution Enhancement Techniques," *Proceedings of SPIE, vol. 3679: Optical Microlithography XII*, Santa Clara, Calif., Mar. 17, 1999, pp. 715-725.

Cao et al., "Standard Cell Characterization Considering Lithography Induced Variations," *Design Automation Conference, 43rd ACM/IEEE*, pp. 801-804 (2006).

Chang et al., "A computational method for the correction of proximity effect in electron-beam lithography," *SPIE*, vol. 1671, pp. 208-214 (1992).

Chen et al., "An Automated and Fast OPC Algorithm for OPC-Aware Layout Design," *Int'l Symp. on Quality Electronic Design*, pp. 782-787 (2007).

Chen et al., "RET Masks for the Final Frontier of Optical Lithography," *Proc. SPIE*, vol. 5853, pp. 168-179 (2005).

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 12, 1997, pp. 458-468.

Cobb, N., and A. Zakhor, "Fast, Low-Complexity Mask Design," *Proceedings of SPIE, vol. 2440: Symposium on Optical/Laser Microlithography VIII*, Santa Clara, Calif., Feb. 24, 1995, pp. 313-327.

Cobb et al., "Fast Optical and Process Proximity Correction Algorithms for Integrated Circuit Manufacturing," *Dissertation*, University of California at Berkeley, 123 pages (1998).

Cobb, N., and A. Zakhor, "Fast Sparse Aerial Image Calculation for OPC," *Proceedings of SPIE, vol. 2621: 15th Annual BACUS Symposium on Photomask Technology and Management, Santa Clara, Calif., Sep. 20-22, 1995, pp. 534-545.

Cobb, N., "Flexible Sparse and Dense OPC Algorithms," *Proceedings of SPIE, vol. 5853: Photomask and Next-Generation Lithography Mask Technology XII*, Yokohama, Japan, Apr. 13, 2005, pp. 693-702.

Cobb, N., and A. Zakhor, "Large Area Phase-Shift Mask Design," *Proceedings of SPIE, vol. 2197: Symposium on Optical/Laser Microlithography VII*, San Jose, Calif., Mar. 2-4, 1994, pp. 348-360.

Cobb, N., et al., "Mathematical and CAD Framework for Proximity Correction," *Proceedings of SPIE, vol. 2726: Symposium on Optical Microlithography IX*, Santa Clara, Calif., Mar. 13-15, 1996, pp. 208-222.

Cobb, N., and Y. Granik, "Model-Based OPC Using the MEEF Matrix," *Proceedings of SPIE, vol. 4889: 22nd Annual BACUS Symposium on Photomask Technology*, Monterey, Calif., Oct. 4, 2002, pp. 1281-1292.

Cobb, N., et al., "New Concepts in OPC," *Proceedings of SPIE, vol. 5377: Optical Microlithography XVII*, Santa Clara, Calif., Feb. 24, 2004, pp. 680-690.

Cobb, N., and Granik, Y., "OPC Methods to Improve Image Slope and Process Window," *Proceedings of SPIE, vol. 5042: Design and Process Integration for Microelectronic Manufacturing*, Santa Clara, Calif., Feb. 27, 2003, pp. 116-125.

Cobb, N., and Y. Granik, "Using OPC to Optimize for Image Slope and Improve Process Window," (document labeled Nov. 20, 2002), *Proceedings of SPIE, vol 5130: Photomask and Next-Generation Lithography Mask Technology X*, Yokohama, Japan, Apr. 16, 2003, pp. 838-846.

Dammel, "Photoresist for microlithography, or the Red Queen's race," *J Microlithogr. Microfabrication Microsyst.*, vol. 1, pp. 270-275 (2002).

Drapeau et al., "Double patterning design split implementation and validation for the 32nm node," *Proc. SPIE*, vol. 6521, pp. 652109-1 through 652109-15 (2007).

Erdmann et al., "Towards Automatic Mask and Source Optimization for Optical Lithography," *Proc. SPIE*, vol. 5377, pp. 646-657 (2004).

Fienup, J.R., "Phase Retrieval Algorithms: A Comparison," *Applied Optics*, vol. 21, pp. 2758-2769 (1982).

Gamo, H., "Matrix Treatment of Partial Coherence," *Progress in Optics*, vol. 3, pp 189-332 (1963).

Gerchberg et al., "A Practical Algorithm for the Determination of Phase From Image and Diffraction Plane Pictures," *Optix*, vol. 35, pp. 237-246 (1972).

Gould, N., "Quadratic Programming: Theory and Methods," $3^{rd}$ *FNRC Cycle in Math. Programming*, Belgium, pp. 1-67 (2000).

Granik, Y., "New Process Models for OPC at Sub-90nm Nodes," *Proceedings of SPIE, vol. 5040: Optical Microlithography XVI*, Santa Clara, Calif., Feb. 25, 2003, pp. 1166-1175.

Granik, Y., "Source Optimization for Image Fidelity and Throughput, " *Journal of Microlithography, Microfabrication, and Microsystems*, vol. 3, Oct. 2004, pp. 509-522.

Granik, Y., "Illuminator Optimization Methods in Microlithography," *Proceedings of SPIE, vol. 5524: Novel Optical Systems Design and Optimization VII*, Denver Colorado, Aug. 2, 2004, pp. 217-229.

Granik, Y., "Solving Inverse Problems of Optical Microlithography," *Proceedings of SPIE, vol. 5754: Optical Microlithography XVIII*, San Jose, Calif., Mar. 1, 2005, pp. 506-526.

Granik, Y., "Generalized MEEF Theory," *Interface 2001*, Nov. 2001.

Granik, Y., et al., "Universal process modeling with VTRE for OPC," *Proceedings of SPIE, vol. 4691: Optical Microlithography XV*, Santa Clara, Calif., Mar. 5, 2002, pp. 377-394.

Granik, Y., and N. Cobb, "MEEF as a Matrix," *Proceedings of SPIE, vol. 4562: 21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE, vol. 4754: Symposium on Photomask and Next-Generation Lithography Mask Technology IX*, Yokohama, Japan, Apr. 23-25, 2002, pp. 146-155.

Gupta et al., "Manufacturing-Aware Physical Design," *Computer Aided Design*, pp. 681-687 (Nov. 9-13, 2003).

Hajj, "Intel's AMT enables rapid processing and info-turn for Intel's DFM test chip vehicle," *Proc. SPIE*, vol. 6730, pp. 67300Q-1 through 67300Q-13 (2007).

Han et al., "On the Solution of Indefinite Quadratic Problems Using an Interior-Point Algorithm," *Informatica*, vol. 3, No. 4, pp. 474-496 (1992).

Hong, L., et al., "Impact of Process Variance on 65 nm Across-Chip Linewidth Variation," *Proceedings of SPIE, vol. 6156: Design and Process Integration for Microelectronic Manufacturing IV*, San Jose, Calif., Feb. 23, 2006, pp. 61560Q1-9.

Hoppe et al., "Beyond rule-based physical verification," *Proc. SPIE*, vol. 6349, pp 63494X.-1 through 63494X-9 (2006).

Hung, C., et al., "Model-Based Insertion of Assist Features Using Pixel Inversion Method: Implementation in 65nm Node," *Proceedings of SPIE, vol. 6283: Photomask and Next-Generation Lithography Mask Technology XIII*, Yokohama, Japan, Apr. 18, 2006, pp. 62832Y.

Hwang et al., "Layer-Specific Illumination for Low k1 Periodic and Semi-Periodic DRAM Cell Patterns: Design Procedure and Application," *Proc SPIE*, vol. 5377, pp. 947-952 (2004).

Inoue et al., "Optimization of Partially Coherent Optical System for Optical Lithography," *Journal of Vacuum Science and Technology*, vol. 10, No. 6, pp. 3004-3007 (1992).

Jang et al., "Manufacturability Evaluation of Model-Based OPC Masks," *Proc SPIE*, vol. 4889, pp. 520-529 (2002).

Li et al., "Transferring Optical Proximity Correction (OPC) Effect into Optical Mode," *Int'l Symp. on Quality Electronic Design*, pp. 771-775 (2007).

Liebmann, L., "Layout Impact of Resolution Enhancement Techniques: Impediment or Opportunity?" *Proceedings of the 2003 International Symposium on Physical Design*, Monterey, Calif., Apr. 6-9, 2003, pp. 110-117.

Liu et al., "Binary and Phase-Shifting Image Design for Optical Lithography," *Proc SPIE*, vol. 1463, pp. 382-399 (1991).

Liu et al., "Optimal Binary Image Design for Optical Lithography," *Proc. SPIE*, vol. 1264, pp. 401-412 (1990).

Lucas et al., "Reticle Enhancement Verification for 65 nm and 45 nm Nodes," *Proc SPIE: Design and Process Integration for Microelectronic Manufacturing IV*, vol. 6156, pp. 61560Q1-9 (2006).

Luk-Pat et al., "Correcting Lithography Hot Spots during Physical-Design Implementation," *Proc. SPIE: Photomask Technology 2006*, vol. 6349, p. 634920-1 through 634920-9 (2006).

Maurer, W., et al., "Process Proximity Correction Using an Automated Software Tool," *Proceedings of SPIE, vol. 3334: Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE, vol. 2884: 16th Annual Symposium on Photomask Technology and Management*, Redwood City, Calif., Sep. 18-20, 1996, pp. 412-418.

Mentor Graphics Corporation, News and Views, "DSM Verification and Analysis," including a partial translation, 7 pp. (document marked Mar. 1999).

Mentor Graphics Corporation, News and Views, "OPC," including a partial translation, 11 pp. (document marked Mar. 1999).

Mentor Graphics Corporation, News and Views, "Calibre," including a partial translation, 9 pp. (document marked Apr. 2000).

Nashold, K., "Image Synthesis—a Means of Producing Super-resolved Binary Images Through Bandlimited Systems," *Dissertation*, University of Wisconsin, Madison, pp. 1-127 (1987).

Oh et al., "Optical Proximity Correction of Critical Layers in DRAM Process of 12 um Minimum Feature Size," Proc. SPIE, vol. 4346, pp. 1567-1574 (2001).

Oh et el., "Resolution Enhancement Through Optical Proximity Correction and Stepper Parameter Optimization for 0.12 um Mask Pattern," *Proc. SPIE*, vol. 3679, pp. 607-613 (1999).

Ohnuma, H., et al., "Lithography Computer Aided Design Technology for Embedded Memory in Logic," *Japanese Journal of Applied Physics* 37(12b):6686-6688, Dec. 1998.

Pack et al., "Physical and Timing Verification of Subwavelength-Scale Designs—Part I: Lithography Impact on MOSFETs," *Proc. SPIE: Design and Process Integration for Microelectronic Manufacturing*, vol. 5042, pp. 51-62 (2003).

Pan, "Lithography-Aware Physical Design," *ASIC*, pp. 35-36 (2005).

Pati et al., "Phase-Shifting Masks for Microlithography Automated Design and Mask Requirements," *Journal of the Optical Society of America A*, vol. 11, No. 9, pp. 2438-2452 (1994).

Perry et al., "Model-based Approach for Design Verification and Co-optimization of Catastrophic and Parametric-related Defects due to Systematic Manufacturing Variations," *Proc. SPIE*, vol. 6521, pp. 65210E-1 through 65210E-10 (2007).

Peterson, J., "Analytical Description of Anti-Scattering and Scattering Bar Assist Features," *Proceedings of SPIE, vol. 4000: Optical Microlithography XIII*, Santa Clara, Calif., Mar. 1, 2000, pp. 77-89.

Philipsen et al., "Printability of hard and soft defects in 193nm lithography," *Proc SPIE: 18th European Conference on Mask Technology for Integrated Circuits and Microcomponents* vol. 4764, pp. 95-112 (2002).

Pikus et al., "Non-uniform Yield Optimization for Integrated Circuit Layout," *Proc. SPIE: Photomask Technology*, vol. 6730, pp. 67300Y-1 through 67300Y-12 (2007).

Poonawala et al., "Prewarping Techniques in Imaging: Applications in Nanotechnology and Biotechnology," *Proc. SPIE*, vol. 5674, pp. 114-127 (2005).

Qi et al., "Global Minimization of Normal Quartic Polynomials Based on Global Descent Directions," *SIAM Journal of Optimization*, vol. 15, No. 1, pp. 275-302 (2005).

Rieger et al., "Anticipating and controlling mask costs within EDA physical design," *Proc. SPIE: Photomask and Next-Generation Lithography Mas Technology X*, vol. 5130, pp. 617-627 (2003).

Rosenbluth et al., "Optimum Mask and Source Patterns to Print a Given Shape," *Journal of Microlithography, Microfabrication, and Microsystems*, vol. 1, pp. 13-30 (2002).

Saleh et al., "Image Construction: Optimum Amplitude and Phase Masks in Photolithography," *Applied Optics*, vol. 24, pp. 1432-1437 (1985).

Saleh, B.E.A., "Optical Bilinear Transformation General Properties," *Optica Acta*, vol. 26, No. 6, pp. 777-799 (1979).

Sandstrom et al., "OML: Optical Maskless Lithography for Economic Design Prototyping and Small-Volume Production," *Proc. SPIE*, vol. 5377, pp. 777-797 (2004).

Sayegh, S.I., "Image Restoration and Image Design in Non-Linear Optical Systems," *Dissertation, University of Wisconsin, Madison*, pp. 1-161 (1982).

Schacht et al., "Calibration of OPC models for multiple focus conditions," *Proc. SPIE: Optical Microlithography XVII*, vol. 5377, pp. 691-703 (2004).

Scheffer, "Physical CAD Changes to Incorporate Design for Lithography and Manufacturability," *Proceedings of the 2004 Conference on Asia South Pacific Design Automation*, pp. 768-773 (2004).

Schellenberg, F., "Sub-Wavelength Lithography Using OPC," *Semiconductor Fabtech*, 9th ed., Mar. 1999.

Shang, S., et al., "Model-Based Insertion and Optimization of Assist Features with Application to Contact Layers," *Proceedings of SPIE, vol. 5992: 25th Annua BACUS Symposium on Photomask Technology*, Monterey, Calif., Oct. 3, 2005, pp. 59921Y.

Socha et al., "Contact Hole Reticle Optimization by Using Interference Mapping Lithography," *Proc. SPIE*, vol. 5446, pp. 516-534 (2004).

Sorensen, D.C., "Newton's Method With a Model Trust Region Modification," *SIAM Journal of Numerical Analysis*, vol. 19, pp. 409-426 (1982).

Sturtevant, J., et al. "Considerations for the Use of Defocus Models for OPC," *Proceedings of SPIE, vol. 5756: Design and Process Integration for Microelectronic Manufacturing III*, San Jose, Calif., Mar. 4, 2005, pp. 427-436.

Sturtevant, J., et al. "Assessing the Impact of Real World Manufacturing Lithography Variations on Post-OPC CD Control," *Proceedings of SPIE, vol. 5756: Design and Process Integration for Microelectronic Manufacturing III*, San Jose, Calif., Mar. 4, 2005, pp. 240-254.

Takajo et al., "Further Study on the Convergence Property of the Hybrid Input-Output Algorithm Used for Phase Retrieval," *Journal of the Optical Society of America A*, vol. 16, No. 9, pp. 2163-2168 (1999).

Tawfic et al., "Feedback Flow to Improve Model-Based OPC Calibration Test Pattern," *Proc. SPIE: Design for Manufacturability through Design-Process Integration*, vol. 6521, pp. 65211J-1 through 65211J-9 (2007).

Torres, J.A., et al., "Contrast-Based Assist Feature Optimization," *Proceedings of SPIE, vol. 4691: Optical Microlithography XV*, Santa Clara, Calif., Mar. 5, 2002, pp. 179-187.

Torres et al., "Design Verification Flow for Model-Assisted Double Dipole Decomposition," *Proc. SPIE: Optical Microlithography XV*, vol. 4691, pp. 585-592 (2002).

Torres, "Fast LFD: Description, Availability and Considerations," *Mentor User's Meeting at SPIE Advanced Lithography*, 27 pp. (2007).

Torres et al., "Integrated Circuit DFM Framework for Deep Sub-Wavelength Processes," *Proc. SPIE: Design and Process Integration for Microelectronic Manufacturing III*, vol. 5756, pp. 39-50 (2005).

Torres, "Integrated Circuit Layout Design Methodology for Deep Sub-Wavelength Processes," Ph.D. Thesis, Oregon Health and Science University, 68 pp. (2005).

Torres et al., "Layout verification in the era of process uncertainty: Requirements for Speed, Accuracy and Process Portability," *BACUS Photomask*, 20 pp. (2007).

Torres, "Layout verification in the era of process uncertainty: Target Process Variability Bands Vs Actual Process Variability Bands," *Proc. SPIE*, vol. 6925, pp 692509-1 through 692509-8 (published online Mar. 4, 2008).

Torres et al., "Model Assisted Double Dipole Decomposition," *Proc. SPIE: Optical. Microlithography XV*, vol. 4691, pp. 407-417 (2002).

Torres et al., "Process Window Modeling Using Compact Models," *Proc. SPIE: 24th Annual BACUS Symposium on Photomask Technology*, vol. 5567, pp. 638-648 (2004).

Torres et al. "RET-Compliant Cell Generation for Sub-130 nm Processes," *Proc. SPIE: Optical Microlithography XV*, vol. 4691, pp. 529-539 (2002).

Torres, "Towards Manufacturability Closure: Process Variations and Layout Design," *Electronic Design Process Symposium*, 7 pp. (2005).

Torres et al., "Unified Process Aware System for Circuit Layout Verification," *Proc SPIE: Design for Manufacturability through Design-Process Integration*, vol. 6521, pp. 652108-1 through 652108-12 (2007).

Tsai et al., "Modeling Litho-Constrained Design Layout," *Design Automation Conference*, pp. 354-357 (2007).

Van Den Broeke, D., et al., "Contact and Via Hole Mask Design Optimization for 65nm Technology Note," *Proceedings of SPIE, vol. 5567: 24th Annual BACUS Symposium on Photomask Technology*, Monterey, Calif., Sep. 14, 2004, pp. 680-690.

Vallishayee et al., "Optimization of Stepper Parameters and Their Influence on CPC," Proc. SPIE, vol. 2726, pp. 660-665 (1996).

Vasek et al., "SEM-Contour Based Mask Modeling," *Proc. SPIE: Optical Lithography XXI*, vol. 6924, pp. 69244Q-1 through 69244Q-11 (2008).

Vasek et al., "SEM-contour-based OPC Model Calibration through the Process Window," *Proc. SPIE: Metrology, Inspection, and Process Control for Microlithography XXI*, pp. 65180D-1 through 65180D-10 (2007).

Word, J., et al. "Advanced Layout Fragmentation and Simulation Schemes for Model Based OPC," *Proceedings of SPIE, vol. 5754: Optical Microlithography XVIII*, San Jose, Calif., Mar. 1, 2005, pp. 1159-1168.

Word et al., "Lithography yield enhancement through optical rule checking," *Proc. SPIE: Advanced Microlithography Technologies*, vol. 5645, pp. 142-153 (2004).

Yehia et al., Simultaneous Model-Based Main Feature and SRAF Optimization for 2D SRAF Implementation to 32 nm Critical Layers, *Proc. SPIE: Photomask Technology*, vol. 6730, pp. 67302K-1 through 67302K-10 (2007).

Yenikaya et al., "A rigorous method to determine printability of a target layout," *Proc. SPIE*, vol. 6521, pp. 652112-1 through 652112-12 (2007).

* cited by examiner

DUAL METRIC OPC

CROSS-REFERENCE TO RELATED APPLICATION

This application is a continuation of U.S. patent application No. 11/673,511, filed Feb. 9, 2007 now U.S. Pat. No. 7,799,487, which application is hereby incorporated by reference in its entirety.

FIELD OF THE INVENTION

The present invention relates to photolithographic processing and, in particular, to methods of preparing layout data for the creation of one or more photolithographic masks.

BACKGROUND

In conventional photolithographic processing, integrated circuits are manufactured by exposing a pattern of features that are contained on a mask or reticle onto a wafer. Light passing through the transparent portions of the mask activates light sensitive resist materials on the wafer that are then chemically and mechanically processed to create the circuit features. The process continues building up the integrated circuit, layer by layer.

As circuit features become increasingly small and more densely packed, optical and other process distortions occur such that the pattern of features on the mask does not correspond to how the features will print on the wafer. Therefore, numerous resolution enhancement techniques (RETs) have been developed to improve the ability of the mask to print a desired pattern on the wafer. One resolution enhancement technique is optical and process correction (OPC). OPC operates by changing the mask pattern to precompensate for expected optical and process distortions such that a pattern of features printed on a wafer will match a desired target layout pattern. Another resolution enhancement technique is the use of subresolution assist features (SRAFs). Such features are small features placed on a mask or reticle that are too small to print on a wafer but operate to improve how an adjacent mask feature prints.

Another technique for improving the ability of a mask to print a desired pattern of features on a wafer is referred to as mask inversion. With mask inversion, a mathematical calculation is performed to determine what an optimal mask pattern should look like in order to create a desired pattern on a wafer. One mask inversion technique is described in published U.S. patent application Ser. No. 11/364,802 by Yuri Granik and assigned to Mentor Graphics Corporation of Wilsonville, Oreg., the assignee of the present invention, and is herein incorporated by reference. While inverse techniques can accurately determine the ideal mask pattern required to print a target pattern of features on a wafer, the methods can be computationally intensive.

Given these problems, there is need for a technique of improving the ability of a mask to print a desired pattern of features on a wafer that approaches the accuracy of a mask inversion technique but is faster to compute and easier to manufacture.

SUMMARY

The present invention is a technique for processing layout data for the creation of one or more photolithographic masks. Layout data is received that defines a number of polygons corresponding to features to be created on a wafer. Polygons are fragmented to define a number of printing feature edge fragments. Subresolution assist features (SRAFs) are defined adjacent one or more of the printing features to improve the ability of a mask to print the features on a wafer. The SRAFs are fragmented to define a number of SRAF edge fragments. One or more SRAF edge fragments are mapped to a printing feature edge fragment. OPC is performed on the printing feature edge fragments and on the mapped SRAF edge fragments to improve the ability of the mask to print the desired target pattern of features on a wafer.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

As indicated above, the present invention is a system for improving the ability of a mask to print a target pattern of features on a wafer with a photolithographic process. Although the present invention is described with respect to creating integrated circuits, it will be appreciated that the present invention can be used in photolithographic processes to create other devices such as microelectrical-mechanical systems (MEMS).

Figure 1:
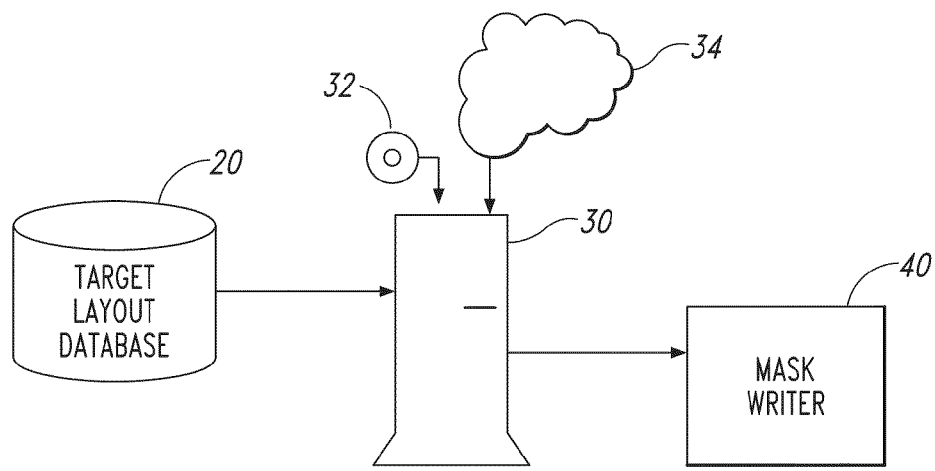
FIG. 1 illustrates a representative computer system with which the present invention can be implemented.

FIG. 1 illustrates one possible computing environment with which the present invention can be implemented. A desired target layout database 20 stores a pattern of features to be created on a wafer. The target pattern of features is generally determined by circuit designers to meet the operation and performance characteristics of the particular integrated circuit to be created. A computer system 30 receives a set of executable instructions from a computer storage media 32 (CD-ROM, tape, DVD, flash memory, hard drive, etc.) or from a wired or wireless communication link 34. The computer system 30 may be a standalone, networked, parallel processing, or other configuration known or later developed. The computer system 30 executes the instructions as will be described in further detail below to create a set of mask data that will print the target pattern of features on a wafer. The mask data is provided to a mask writer 40 that creates one or more masks used in the photolithographic printing process.

In one embodiment of the invention, the target layout database 20 is a hierarchical database that defines the pattern of features in a layout description language such as GDS-II or OASIS™. In GDS-II and OASIS, features are defined as polygons that may be manipulated by the computer system 30 to create the mask data that will ensure that the desired feature pattern is printed on a wafer. In some embodiments, the target layout database 20 stores the target layout pattern data in a hierarchical manner including data defining a number of cells that may be reused in the integrated circuit. By storing the data hierarchically, the size of the layout database can be reduced.

Figure 2:
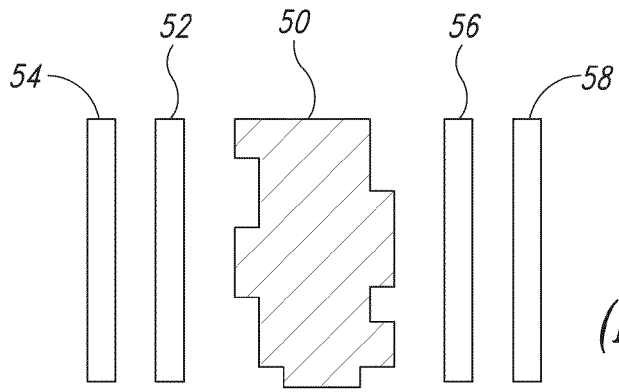
FIG. 2 illustrates a conventional method of placing SRAFs adjacent an OPC corrected mask feature.

FIG. 2 illustrates one conventional technique for enhancing the printability of a feature. In this embodiment, the target feature to be printed is a rectangle and the corresponding mask feature 50 is generally rectangular. Optical and other process distortions cause the feature 50 to print a shape on the wafer that may differ substantially from its shape on the mask.

To correct for these distortions, the shape 50 is analyzed with an optical and process correction (OPC) tool whereby the edges defining the feature 50 are fragmented and analyzed to determine how the edge fragments will print on the wafer. Each edge fragment can be moved outwards or inwards to precompensate for the expected optical distortions so that the feature printed on the wafer will match the desired target feature.

Another commonly used resolution enhancement technique is to add one or more subresolution assist features (SRAFs) 52, 54, 56, 58 to improve the ability of the photolithographic system to print the target feature on the wafer.

Figure 3:
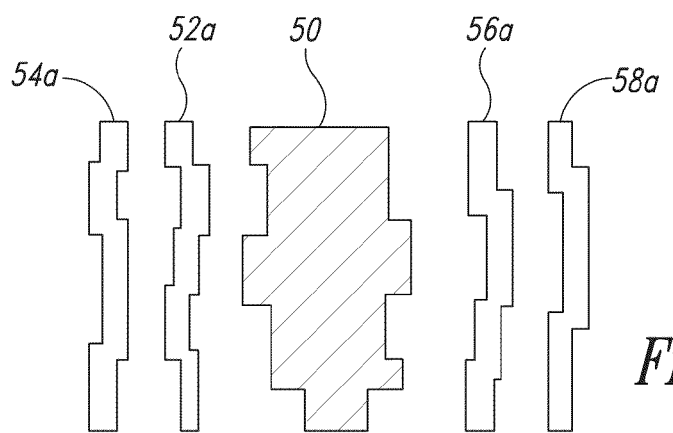
FIG. 3 illustrates an OPC corrected mask feature and OPC corrected SRAFs in accordance with one embodiment of the present invention.

In conventional OPC, only the features that are printed on the wafer are OPC corrected. Any SRAFs added to a layout are not modified and remain as shown in FIG. 2. However, in accordance with one embodiment of the present invention, it has been determined that the ability to print a desired feature pattern on a wafer can be further improved if one or more of the SRAFs 52*a*, 54*a*, 56*a*, 58*a* are also OPC corrected, as shown in FIG. 3.

Figure 4:
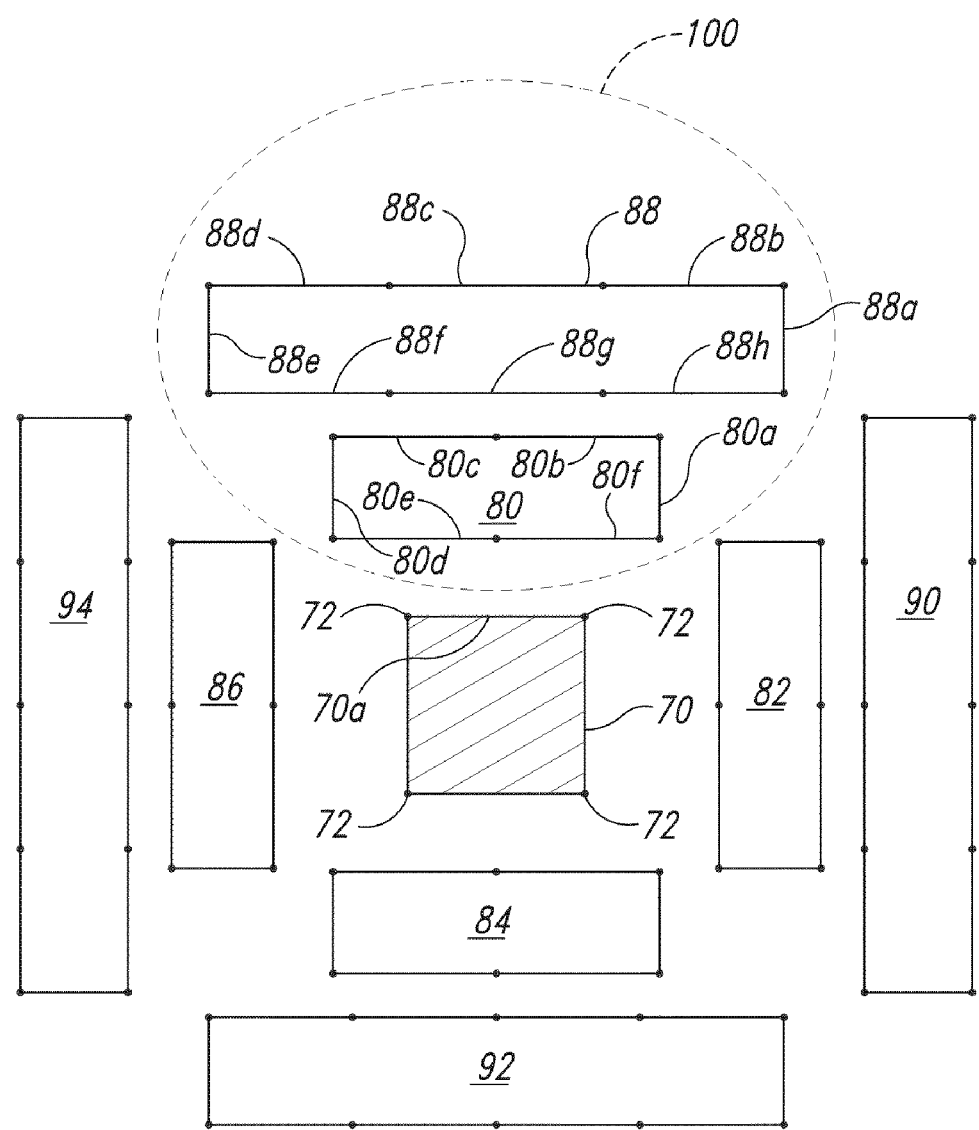
FIG. 4 illustrates mapping a number of SRAF edge fragments to a printing feature edge fragment in accordance with one embodiment of the present invention.

FIG. 4 illustrates a target feature such as a square contact or via to be created on a wafer. In the layout database, the via is defined by a polygon 70 having a number of vertices 72 that define the corners of the polygon. Additional fragmentation points can be added to the polygon 70 that defines the via for use in performing OPC. Surrounding the polygon 70 are a number of SRAFs 80-94 positioned symmetrically around the sides of the polygon 70.

In accordance with one embodiment of the invention, the SRAFs are fragmented thereby defining a number of SRAF edge fragments. For example, SRAF 80 is fragmented to include SRAF edge fragments 80*a*-80*f*. Similarly, SRAF 88 is fragmented to include a number of SRAF edge fragments 88*a*-88*h*. In one embodiment of the invention, each SRAF edge fragment within a search area 100 of a printing feature edge is linked or mapped to the corresponding feature edge. In one embodiment, the search area extends outwards in one direction from the printing edge feature. In another embodiment, the printing edge feature is positioned in the middle of the search area and any SRAF edge segment around the printing edge feature is mapped to the printing edge feature. Alternatively, the search area could be user defined. For example, the SRAF edge segments of SRAFs 80 and 88 are mapped to an edge fragment 70*a* of the polygon 70. The search area 100 may be predefined or user selected and generally is set to be at least as large as the optical radius of the photolithographic printing system to be used.

In accordance with one embodiment of the invention, the edge fragments of the polygon 70 are moved by an OPC program in order to improve the fidelity with which the feature printed on a wafer matches the target feature. In one embodiment of the invention, each edge fragment of the printing features is analyzed to minimize its edge placement error (EPE). One suitable OPC program is the Calibre® program suite available from Mentor Graphics of Wilsonville, Oreg. However, other OPC programs could be used.

In accordance with one embodiment of the present invention, one or more of the SRAF edge fragments are also analyzed by the OPC program to improve a second printing/imaging parameter of a linked printing edge fragment. In the example shown, SRAF edge fragments 80*a*-80*f* of SRAF 80 and SRAF edge fragments 88*a*-88*h* of SRAF 88 are linked to the printing edge fragment 70*a* and are analyzed to improve a second printing/imaging characteristic of a linked edge fragment 70*a*.

In one embodiment of the invention, the second printing/imaging characteristic is different than that used by the OPC program to determine the position of the printing edge fragments. In one embodiment of the invention, the SRAF edge fragments are analyzed and moved, if necessary, to improve the slope, image log slope, or contrast at the nominal dose and focus settings. Alternatively, the SRAF edge fragments can be analyzed and moved if necessary to improve the EPE, slope, image log slope or contrast of the printing edge fragment at an out of focus/dose conditions. In another alternative embodiment, combinations of these printing/imaging characteristics could be used as the second printing/imaging characteristic.

Once the relationship between the movement of a mapped SRAF edge fragment and the second printing/imaging characteristic of the printing feature is determined, the position of the SRAF edge fragments is adjusted by the OPC program to improve the second printing/imaging characteristic of the printing feature. In one embodiment of the invention, the OPC program is a matrix-based system that analyzes the influence of a number of SRAF edge fragments on a linked edge fragment under consideration. In one embodiment, one or more matrices analyze the effect of each mapped SRAF edge fragment to a corresponding edge fragment of a printing feature. With the Calibre program, the matrix OPC program returns the edge position error (EPE), slope, $I_{max}$, $I_{min}$, and curvature of the aerial image intensity at a printing threshold intensity). In addition, the Calibre OPC program returns two values that are unique to the linked edge fragments including (1) the mask error factor or MEEF, which is defined as the change in EPE for a printing edge versus the change in position of a linked edge and (2) slope factor, which is defined as how much the slope changes for a printing edge versus a change in the position of each linked edge. From the two values, MEEF and slope factor, it can be determined if one or more of the SRAF edge fragments should be moved and in which direction in order to improve the second printing/image characteristic of the mapped printing edge fragment.

Figure 5:
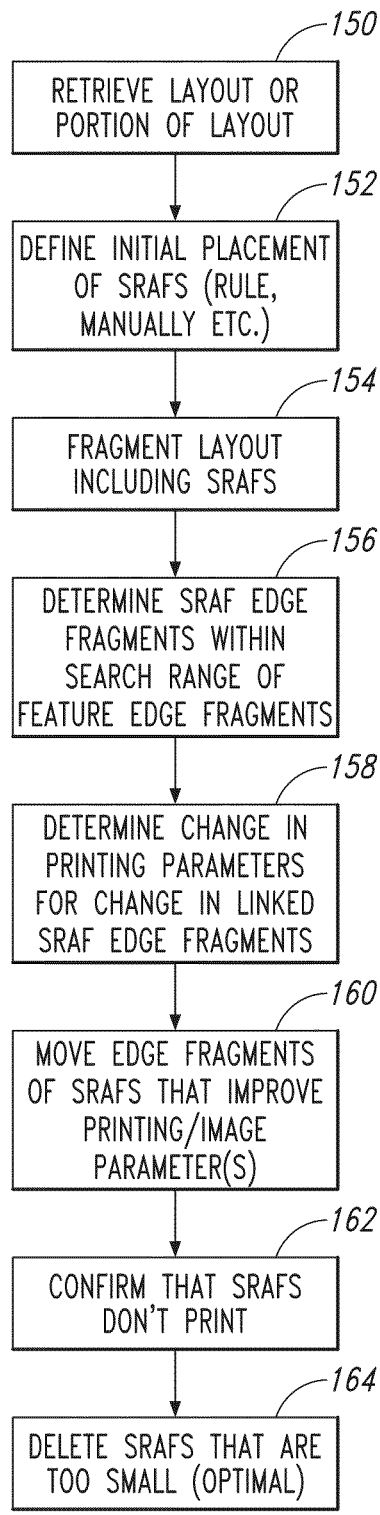
FIG. 5 is a flow chart of steps performed in accordance with one embodiment of the present invention.

FIG. 5 is a flow chart illustrating the steps performed by one embodiment of the present invention. Although the steps are described in a particular order, it will be appreciated that the steps could be performed in a different order and still achieve the functionality described. Beginning at 150, a desired target layout or a portion thereof is obtained by a computer system. At 152, an initial placement of SRAFs is made adjacent to the features that benefit from them. In one embodiment, SRAFs are placed in a separate layer of the layout database. The SRAFs may be placed by a rule or via a model as determined from previous experience or simulations. Alternatively, the SRAFs may be placed manually by a circuit designer.

At 154, the polygons defining printing features of the layout and the SRAFs are fragmented. The SRAFs may be fragmented to have the same, smaller or larger sized edge fragments than those of the polygons corresponding to the printing features. However, in one embodiment of the invention, the SRAFs are fragmented to have larger edge fragments than those of the printing features. The fragmentation of the polygons corresponding to printing features and the SRAFs may occur at the same time or at different times.

At 156, the computer system determines which SRAF edge fragments are within a search distance of a printing feature edge fragment. As shown in FIG. 4, this may be accomplished by extending a circle outwards from the printing edge fragment and mapping/linking each SRAF edge fragment within the circle to the printing edge fragment. At 158, the computer system determines the relationship between a printing/imaging characteristic of a printing edge fragment versus a change in position of the linked SRAF edge fragments.

At 160, OPC corrections are made to the printing edge fragments and the OPC corrections of the SRAF edge fragments that improve the selected second printing/imaging parameter are also made. In one embodiment, all OPC changes are made at the same time. However, it is possible that all the OPC corrections to the printing edge fragments could be made first followed by all the OPC corrections for the SRAF edge fragments or vice versa. Alternatively, OPC changes to both the printing edge fragments and the SRAF edge fragments could be made in a portion of the integrated circuit layout such as a tiled area.

At 162, the computer system checks to see that the SRAF edge fragments have not been made so large by the recommended OPC correction that they now print on the wafer. If so, the SRAF edge fragments are prevented from defining an area larger than the maximum SRAF size to ensure that the SRAFs do not print on a wafer. Alternatively, the SRAFS may be altered so that they no longer print by, for example, dividing an SRAF into two or more smaller SRAFs or by removing a center portion of the SRAF etc. At 164, the computer system determines whether an SRAF edge fragment has been moved by an OPC correction to define an SRAF area that is so small that it performs no function or has no practical benefit in the mask layout. For example, SRAFs that are smaller than some predetermined size contribute little to the printability of a printing feature. Therefore, the SRAFs that are made too small by a recommended OPC correction can be deleted from the mask layout. Alternatively, the SRAFs can be fixed at a minimum size by the computer and not allowed to be made any smaller by an OPC correction. Step 164 is generally a mask clean up step and may be optional. Further, clean up steps may include minimizing jogs that are smaller than a threshold value in an outline of an SRAF so that it can be easily manufactured on a mask.

Figure 6:
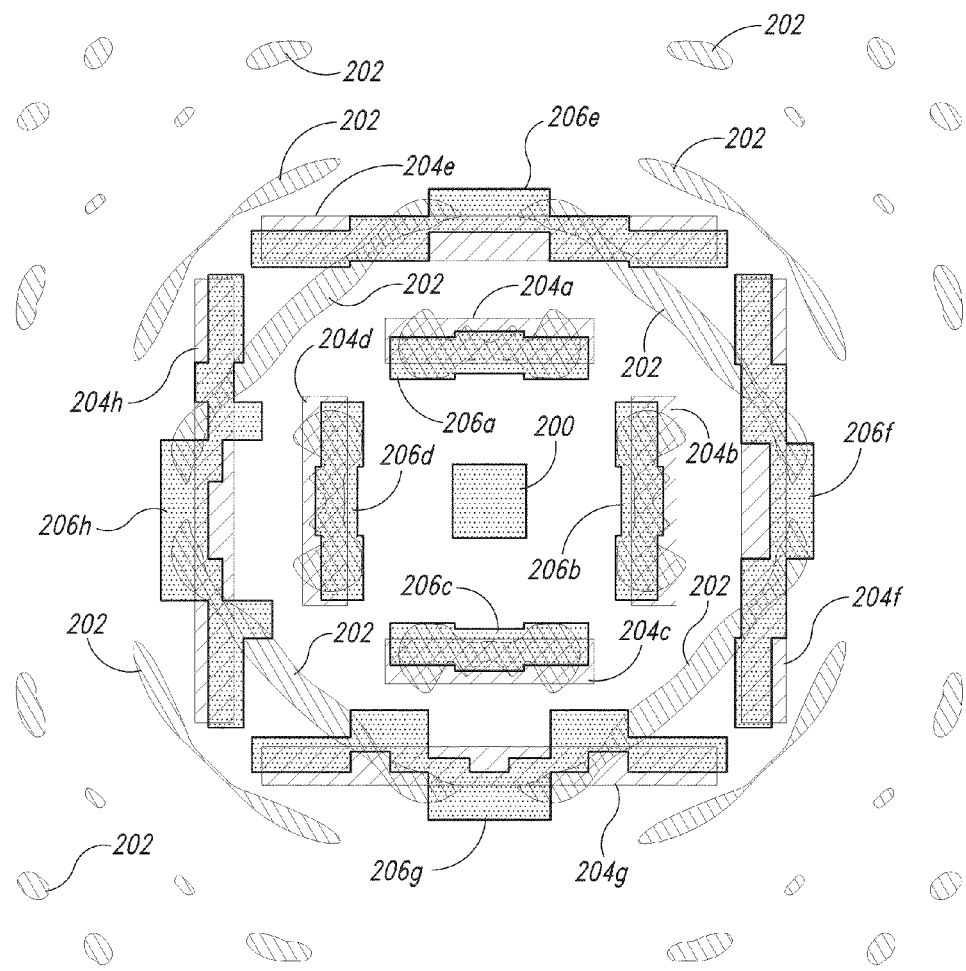
FIG. 6 illustrates results of a mask inversion calculation, SRAFs placed to simulate the mask inversion, and OPC corrected SRAFs in accordance with an embodiment of the present invention.

FIG. 6 compares how OPC corrected SRAFs compare with mask features as determined by a mask inversion calculation illustrates one example of a desired target feature such as a square via 200 that is to be printed on a wafer. Surrounding the feature 200 are a number of irregularly shaped optimized mask features 202 that are generally defined symmetrically around the via 200. Each of the optimized mask features 202 is determined by a mathematical mask inversion process as referenced above. The optimized mask features 202 are an embodiment of the present invention simulated by placing rectangular SRAFs 204a-204h symmetrically around the via 200. Each of the SRAFs 204a-204h is sized such that it will not print on the wafer. The SRAFs 204a-204h are fragmented and OPC corrected to form the irregularly shaped SRAFs labeled 206a-206h. As can be seen, the OPC corrected SRAFs generally mimic the shape of the optimized features 202 as determined by the mask inversion process.

Figure 7:
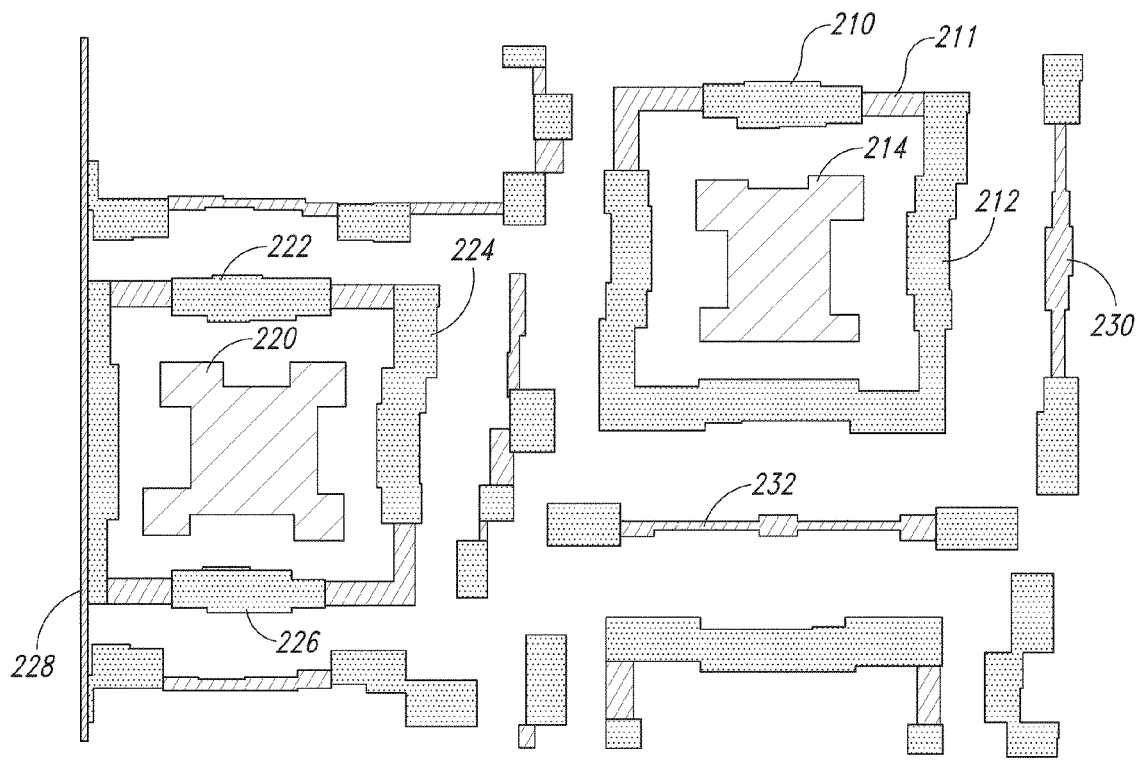
FIG. 7 illustrates SRAFs to be cleaned from a mask layout.

FIG. 7 illustrates a number of OPC corrected SRAFs 210, 212 that surround an OPC corrected printing feature 214. Similarly, an OPC corrected printing feature 220 is surrounded by OPC corrected SRAFs 222, 224, 226, 228. Between OPC corrected features 210 and 212 is a portion of the SRAF 211 that is smaller than a minimum size SRAF. Therefore, SRAF 211 may contribute little or nothing to the printability of the printing feature 214 and be removed from the layout in a clean up step. Similarly, SRAFs that are below a predetermined threshold can be seen between SRAFs 222, 224, 226, and 228. In one embodiment of the invention, any SRAF, such as SRAFs 230, 232 having a size that is smaller than a predetermined minimum can be removed from the layout. Alternatively, the SRAFs can be made to have a minimum size and left in the layout.

The present invention provides a mechanism for improving the printability of a mask to print a desired pattern of features on a wafer with a photolithographic system by adding SRAFs to a layout and performing OPC on the SRAFs. The present invention provides a result which is believed to be similar to that obtainable with a mathematical mask inversion technique but is significantly quicker to compute and easier to fabricate on a mask.

Attached as an Appendix is an example of a script that implements the present invention within the Calibre® software program from Mentor Graphics. Those skilled in the art will recognize that the operations performed by the scripts are equally applicable to other OPC software tools/engines.

While illustrative embodiments have been illustrated and described, it will be appreciated that various changes can be made therein without departing from the scope of the invention. For example, although the disclosed embodiment is illustrated using SRAFs, it will be appreciated that the invention can be used with any non-printing feature added to a mask that improves the ability of the mask to create a desired pattern on a wafer. For example, phase shifters could be OPC corrected to improve the printing of a linked edge fragment, as well as negative SRAFs (i.e., holes in printing features). Therefore, the scope of the invention is to be determined from the following claims and equivalents thereof.

The embodiments of the invention in which an exclusive property or privilege is claimed are defined as follows:

1. A method of analyzing data for use in creating a mask that prints a desired pattern of features via a photolithographic process, comprising:

obtaining data representative of a number of polygons that define a desired pattern of features to be printed via a photolithographic process;

adding data representing one or more non-printing features to the data that defines one or more of the printing features;

fragmenting the data to define printing feature edge fragments and non-printing feature edge fragments;

mapping one or more non-printing feature edge segments to a printing feature edge fragment; and using a computer, determining OPC corrections for the printing feature edge fragments to improve its edge placement error and determining OPC corrections for one or more of the mapped non-printing feature edge segments to improve a second printing/imaging characteristic of the mapped printing feature edge fragment.

2. The method of claim 1, wherein the non-printing features are subresolution assist features (SRAFs).

3. The method of claim 1, wherein the non-printing features are phase shifters.

4. A method comprising:
with a computer, mapping one or more non-printing feature edge fragments to a printing feature edge fragment, wherein:
the printing feature edge fragment is based on fragmented data representative of a desired pattern of features to be printed via a photolithographic process, and
the non-printing edge fragments are based on fragmented data representative of one or more non-printing features defined to improve the ability to print the desired pattern of features;
moving the printing feature edge fragment to improve a first printing/imaging characteristic of the mapped printing feature edge fragment to produce moved printing feature edge fragment data; and
moving at least one of the mapped non-printing feature edge fragments to improve a second printing/imaging characteristic of the mapped printing feature edge fragment to produce moved non-printing feature edge fragment data.

5. The method of claim 4, further comprising determining if the moving the at least one mapped non-printing feature edge fragment will cause one or more of the non-printing features to print via a photolithographic process and, if so, limiting the moving of the non-printing edge fragment so that the non-printing features will not print via the photolithographic process.

6. The method of claim 5, further comprising limiting the moving of the at least one non-printing edge fragment to limit the correction of the non-printing feature to a size that will not print the non-printing feature via the photolithographic process.

7. The method of claim 5, further comprising modifying the non-printing feature edge fragment such that its non-printing feature will not print via the photolithographic process.

8. The method of claim 4, further comprising:
determining if the moving the at least one mapped non-printing feature edge fragment will cause one or more of the non-printing features to be smaller than a minimum size and, if so, deleting all or a portion of the one or more of the non-printing features that are smaller than the minimum size.

9. The method of claim 4, further comprising:
determining if the moving the at least one mapped non-printing feature edge fragment will cause one or more of the non-printing features to be smaller than a minimum size and, if so, limiting the moving the at least one mapped non-printing feature edge fragment such that the one or more of the non-printing features is not smaller than the minimum size.

10. The method of claim 4, wherein at least one of the non-printing features is a phase shifter or a negative SRAF.

11. The method of claim 4, wherein the moving the printing feature edge fragment is based on an OPC correction.

12. The method of claim 4, wherein the moving the at least one mapped non-printing feature edge fragments is based on an OPC correction.

13. The method of claim 4, wherein the first printing/imaging characteristic is edge placement error (EPE).

14. The method of claim 4, wherein the second printing/imaging characteristic is at least one or more of the following: slope, image log slope, or contrast, at the nominal dose and focus settings.

15. The method of claim 4, wherein the second printing/imaging characteristic is at least one or more of the following: EPE, slope, image log slope or contrast of the printing edge fragment at out of focus/dose conditions.

16. The method of claim 4, wherein the second printing/imaging characteristic is at least one or more of the following: one or more combinations of nominal (slope, contrast, image log slope, or slope) and/or out of focus/dose (edge placement error, slope, image log slope, or contrast).

17. The method of claim 4, further comprising manufacturing a photolithographic mask or reticle using the moved printing feature edge fragment data and the moved non-printing feature edge fragment data.

18. The method of claim 4, further comprising manufacturing a circuit comprising one or more features created using one or more photolithographic masks or reticles created using the moved printing feature edge fragment data and the moved non-printing feature edge fragment data.

19. One or more computer-readable storage media storing one or more computer-readable instructions that when executed by a computer, cause the computer to perform a method, the method comprising:
mapping one or more non-printing feature edge fragments to a printing feature edge fragment, wherein:
the printing feature edge fragment is based on fragmented data representative of a desired pattern of features to be printed via a photolithographic process, and
the non-printing edge fragments are based on fragmented data representative of one or more non-printing features defined to improve the ability to print the desired pattern of features;
moving the printing feature edge fragment to improve a first printing/imaging characteristic of the mapped printing feature edge fragment to produce moved printing feature edge fragment data; and
moving at least one of the mapped non-printing feature edge fragments to improve a second printing/imaging characteristic of the mapped printing feature edge fragment to produce moved non-printing feature edge fragment data.

20. A method, comprising:
with a computer,
receiving data defining printing features of a target layout pattern for a photolithographic process and non-printing features of the target layout pattern, the non-printing features being defined adjacent one or more of the printing features to improve the ability to print the printing features with the photolithographic process, wherein the printing features include one or more OPC corrections made to improve a first printing/imaging parameter, and
moving at least one non-printing edge fragment of at least one of the non-printing features, the moving calculated to improve a second printing/imaging parameter, wherein the second printing/imaging characteristic is different than the first printing/imaging parameter.

21. The method of claim 20, further comprising making the OPC corrections by moving at least one printing edge fragment defining at least a portion of the printing features to improve the first printing/imaging parameter.

22. The method of claim 20, wherein the OPC corrections are made to improve the first printing/imaging parameter before the moving the at least one non-printing edge fragment.

23. The method of claim 20, wherein the moving the at least one non-printing edge fragment occurs before the OPC corrections are made to improve the first printing/imaging parameter.

24. The method of claim 20, wherein both the moving the at least one non-printing edge fragment and the OPC corrections are made on a tiled area of the target layout pattern.

25. The method of claim 20, further comprising determining that the at least one non-printing edge fragment is within a search distance of one or more of the printing features, and based on the determining, performing the moving the at least one non-printing edge fragment.

26. The method of claim 20, further comprising determining a relationship between a printing/imaging characteristic of at least one of the printing features versus a change in position of the at least one non-printing edge fragment, and based on the determining, performing the moving the at least one non-printing edge fragment.

27. The method of claim 20, further comprising removing at least a portion of one or more of the non-printing features having a moved edge fragment based on the area of the one or more non-printing features.

28. The method of claim 20, further comprising altering one or more of the non-printing features having a moved edge fragment so that the altered non-printing features will not print.

29. The method of claim 20, wherein at least one of the non-printing features is an SRAF.

30. The method of claim 20, wherein at least one of the non-printing features is a phase shifter or a negative SRAF.

31. One or more computer-readable storage media storing one or more computer-readable instructions that when executed by a computer, cause the computer to perform a method, the method comprising:
receiving data defining printing features of a target layout pattern for a photolithographic process and non-printing features of the target layout pattern, the non-printing features being defined adjacent one or more of the printing features to improve the ability to print the printing features with the photolithographic process, wherein the printing features include one or more OPC corrections made to improve a first printing/imaging parameter, and
moving at least one non-printing edge fragment of at least one of the non-printing features, the moving calculated to improve a second printing/imaging parameter, wherein the second printing/imaging characteristic is different than the first printing/imaging parameter.

32. A computer-readable storage device storing:
data representing first OPC corrections for one or more printing features, and
data representing second OPC corrections for one or more non-printing features, the first OPC corrections improving a first printing/imaging characteristic of the printing features, the second OPC corrections improving a second printing/imaging characteristic of the non-printing features.

33. The computer-readable storage media of claim 19, wherein the method further comprises:
determining if the moving the at least one mapped non-printing feature edge fragment will cause one or more of the non-printing features to print via a photolithographic process and, if so, limiting the moving of the non-printing edge fragment so that the non-printing features will not print via the photolithographic process.

34. The computer-readable storage media of claim 19, wherein the method further comprises:
determining if the moving the at least one mapped non-printing feature edge fragment will cause one or more of the non-printing features to be smaller than a minimum size and, if so, deleting all or a portion of the one or more of the non-printing features that are smaller than the minimum size.

35. The computer-readable storage media of claim 19, wherein the method further comprises:
determining if the moving the at least one mapped non-printing feature edge fragment will cause one or more of the non-printing features to be smaller than a minimum size and, if so, limiting the moving the at least one mapped non-printing feature edge fragment such that the one or more of the non-printing features is not smaller than the minimum size.

36. The computer-readable storage media of claim 19, wherein at least one of the non-printing features is a phase shifter or a negative SRAF.

37. The computer-readable storage media of claim 19, wherein the first printing/imaging characteristic is edge placement error (EPE).

38. The computer-readable storage media of claim 19, wherein the second printing/imaging characteristic is at least one or more of the following: one or more combinations of nominal (slope, contrast, image log slope, or slope) and/or out of focus/dose (edge placement error, slope, image log slope, or contrast).

39. The computer-readable storage media of claim 31, wherein the method further comprises making the OPC corrections by moving at least one printing edge fragment defining at least a portion of the printing features to improve the first printing/imaging parameter.

40. The computer-readable storage media of claim 31, wherein the method further comprises determining a relationship between a printing/imaging characteristic of at least one of the printing features versus a change in position of the at least one non-printing edge fragment, and based on the determining, performing the moving the at least one non-printing edge fragment.

41. The computer-readable storage media of claim 31, wherein at least one of the non-printing features is a phase shifter or a negative SRAF.

* * * * *